United States Patent
Money

(10) Patent No.: US 11,977,708 B2
(45) Date of Patent: May 7, 2024

(54) DISPLACEMENT SENSING APPARATUS

(71) Applicant: TouchNetix Limited, Fareham (GB)

(72) Inventor: Robert Money, Fareham (GB)

(73) Assignee: TouchNetix Limited, Fareham (GB)

(*) Notice: Subject to any disclaimer, the term of this patent is extended or adjusted under 35 U.S.C. 154(b) by 0 days.

(21) Appl. No.: 18/044,281

(22) PCT Filed: Aug. 24, 2021

(86) PCT No.: PCT/GB2021/052195
§ 371 (c)(1),
(2) Date: Mar. 7, 2023

(87) PCT Pub. No.: WO2022/049366
PCT Pub. Date: Mar. 10, 2022

(65) Prior Publication Data
US 2023/0333701 A1 Oct. 19, 2023

(30) Foreign Application Priority Data

Sep. 7, 2020 (GB) .................................. 2014036

(51) Int. Cl.
*G06F 3/044* (2006.01)
(52) U.S. Cl.
CPC .......... *G06F 3/0447* (2019.05); *G06F 3/0443* (2019.05)
(58) Field of Classification Search
CPC ............................. G06F 3/0447; G06F 3/0443
(Continued)

(56) References Cited

U.S. PATENT DOCUMENTS

| 2014/0028575 A1 | 1/2014 | Parivar |
| 2017/0255294 A1 | 9/2017 | Shepelev |

(Continued)

FOREIGN PATENT DOCUMENTS

| EP | 2523072 A1 | 11/2012 |
| GB | 2554736 A | 4/2018 |

(Continued)

OTHER PUBLICATIONS

Combined Search and Examination Report issued for priority United Kingdom Application No. 2014036.4.
(Continued)

*Primary Examiner* — Mark Edwards
(74) *Attorney, Agent, or Firm* — Renner, Otto, Boisselle & Sklar, LLP

(57) ABSTRACT

Disclosed a sensing apparatus having a frame element and a displaceable element mounted relative to the frame element. The sensing apparatus comprises a plurality of displacement sensor elements each configured to provide a displacement sensor output signal indicative of a displacement between the frame element and the displaceable element, wherein the plurality of displacement sensor elements are arranged at different spatial locations relative to the displaceable element and configured to provide a displacement sensor output signal indicative of a displacement between the frame element and the displaceable element at the respective spatial location. The sensing apparatus further comprises processing circuitry configured to obtain the displacement sensor output signals from the plurality of displacement sensor elements and determine whether displacement of the displaceable element is a valid displacement by comparing at least the ratio between the displacement sensor output signals to one or more expected ratios.

16 Claims, 6 Drawing Sheets

(58) Field of Classification Search
USPC .......................................................... 345/173
See application file for complete search history.

(56) References Cited

U.S. PATENT DOCUMENTS

2019/0212215 A1* 7/2019 Okada ..................... G01L 25/00
2019/0391689 A1* 12/2019 Hristov ............... G06F 3/04166

FOREIGN PATENT DOCUMENTS

| GB | 2554736 A8 | 4/2018 | |
|---|---|---|---|
| GB | 2558912 A * | 7/2018 | ........... G06F 3/0414 |
| GB | 2558912 A | 7/2018 | |
| GB | 2566271 A | 3/2019 | |
| WO | 2021044533 A1 | 3/2021 | |

OTHER PUBLICATIONS

International Search Report and Written Opinion issued for priority International Application No. PCT/GB2021/052195.

* cited by examiner

| Coordinates (X,Y) | Ratio A:B | Ratio A:C | Ratio A:D | ... |
|---|---|---|---|---|
| 0,0 | 2:3 | 2:3 | 1:2 | |
| 1,0 | 1:2 | 2:3 | 1:2 | |
| 2,0 | 4:5 | 1:4 | 4:5 | |
| 0,1 | 2:1 | 3:1 | 1:1 | |
| 1,1 | 1:1 | 1:1 | 1:1 | |
| 2,1 | ... | ... | ... | |
| ... | | | | |

DISPLACEMENT SENSING APPARATUS

This application is a national phase of International Application No. PCT/GB2021/052195 filed Aug. 24, 2021, which claims priority to United Kingdom Application No. 2014036.4 filed Sep. 7, 2020, each of which is hereby incorporated herein by reference in its entirety.

BACKGROUND OF THE INVENTION

The present invention relates to the field of capacitance sensing, and in particular to apparatuses employing both capacitance sensing for sensing a touch position on a touch sensitive surface and for sensing displacement of a touch sensitive surface acting as an additional input.

Capacitive sensing techniques have become widespread for providing touch-sensitive inputs, for example in computer tablets, mobile phones, and in many other applications. Touch sensitive input devices are generally perceived to be more aesthetically pleasing than input devices that are based on mechanical switches. In some instances, additional inputs may be provided by allowing the touch-sensitive surface to be displaced, e.g., by a user pressing a moveably mounted touch-sensitive surface.

Touch-sensitive inputs are becoming more wide spread and challenges are faced when integrating touch-sensitive inputs into more complex systems. For example, touch-sensitive inputs are being explored in the motor industry to act as user interfaces for operating various functions on a car or other vehicles. Due to the aesthetically pleasing factor, in addition to the flexibility permitted by such touch-sensitive inputs, these touch sensitive-inputs are replacing some of the more conventional mechanical buttons that one may find on a conventional dashboard of a car or the like.

However, the design and surfaces that touch-sensitive manufactures have to work with in these vehicles may be more complex than manufactures have previously worked with, e.g., car dashboards are often curved and often buttons or the like are provided in spaces around the steering wheel or other aspects (e.g., air bags) which often means the same available to work with is not of a standard shape or flat.

When dealing with complex spaces, identifying whether a user actually presses the displaceable element of a touch sensitive apparatus can be difficult to reliably perform while also maximising the use of available space in the vehicle.

Thus, there is therefore a desire for apparatus and methods that can help to address these kinds of issue.

SUMMARY OF THE INVENTION

According to a first aspect of the invention there is disclosed a sensing apparatus having a frame element and a displaceable element mounted relative to the frame element. The sensing apparatus comprises a plurality of displacement sensor elements each configured to provide a displacement sensor output signal indicative of a displacement between the frame element and the displaceable element, wherein the plurality of displacement sensor elements are arranged at different spatial locations relative to the displaceable element and configured to provide a displacement sensor output signal indicative of a displacement between the frame element and the displaceable element at the respective spatial location. The sensing apparatus further comprises processing circuitry configured to obtain the displacement sensor output signals from the plurality of displacement sensor elements and determine whether displacement of the displaceable element is a valid displacement by comparing at least the ratio between the displacement sensor output signals from a pair of the plurality of displacement sensor elements to one or more expected ratios for the pair of displacement sensor elements obtained in advance.

According to a second aspect of the invention there is disclosed a device comprising the sensing apparatus of first aspect.

According to a third aspect of the invention there is disclosed a method for determining whether a displacement applied to a displaceable element mounted relative to a frame element is a valid displacement. The method includes: obtaining a plurality of displacement sensor element output signals indicative of a displacement between the frame element and the displaceable element from a plurality of displacement sensor elements, wherein the plurality of displacement sensor elements are arranged at different spatial locations relative to the displaceable element and provide a displacement sensor output signal indicative of a displacement between the frame element and the displaceable element at the respective spatial location; and determining whether displacement of the displaceable element is a valid displacement by comparing at least the ratio between the displacement sensor output signals from a pair of the plurality of displacement sensor elements to one or more expected ratios for the pair of displacement sensor elements obtained in advance.

It will be appreciated that features and aspects of the invention described above in relation to the first and other aspects of the invention are equally applicable to, and may be combined with, embodiments of the invention according to other aspects of the invention as appropriate, and not just in the specific combinations described above.

BRIEF DESCRIPTION OF THE DRAWINGS

The invention is now described by way of example only with reference to the following drawings in which.

DETAILED DESCRIPTION

Aspects and features of certain examples and embodiments of the present invention are discussed/described herein. Some aspects and features of certain examples and embodiments may be implemented conventionally and these are not discussed/described in detail in the interests of brevity. It will thus be appreciated that aspects and features of apparatus and methods discussed herein which are not described in detail may be implemented in accordance with any conventional techniques for implementing such aspects and features.

Figure 1:
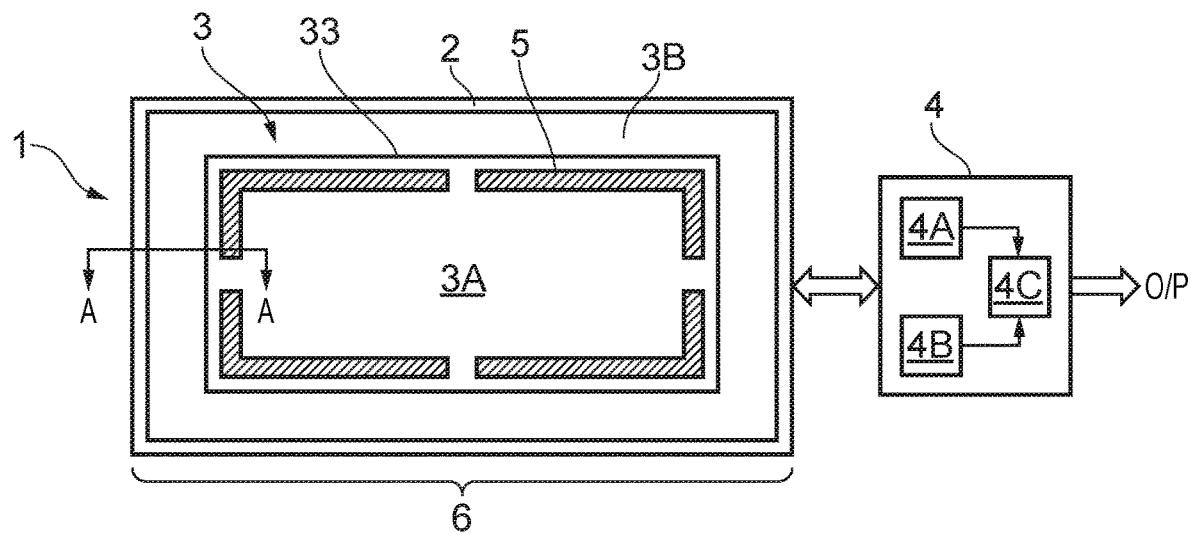
FIG. 1 schematically represents a sensor element and controller element of a sensing apparatus according to certain embodiments of the invention.
Figure 2:
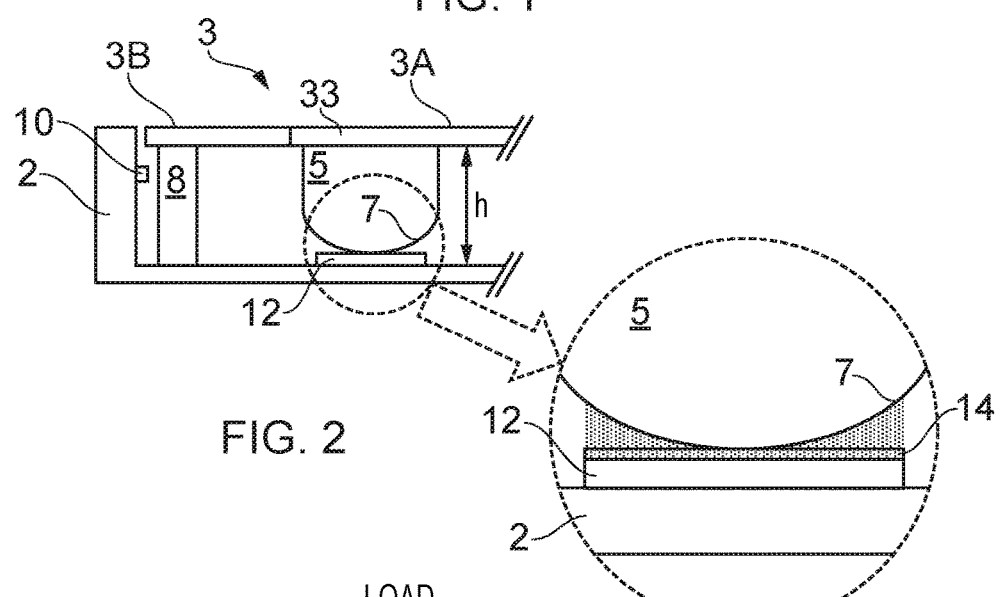
FIG. 2 schematically shows in cross-section a portion of the sensor element of FIG. 1 in a non-displaced state.
Figure 3:
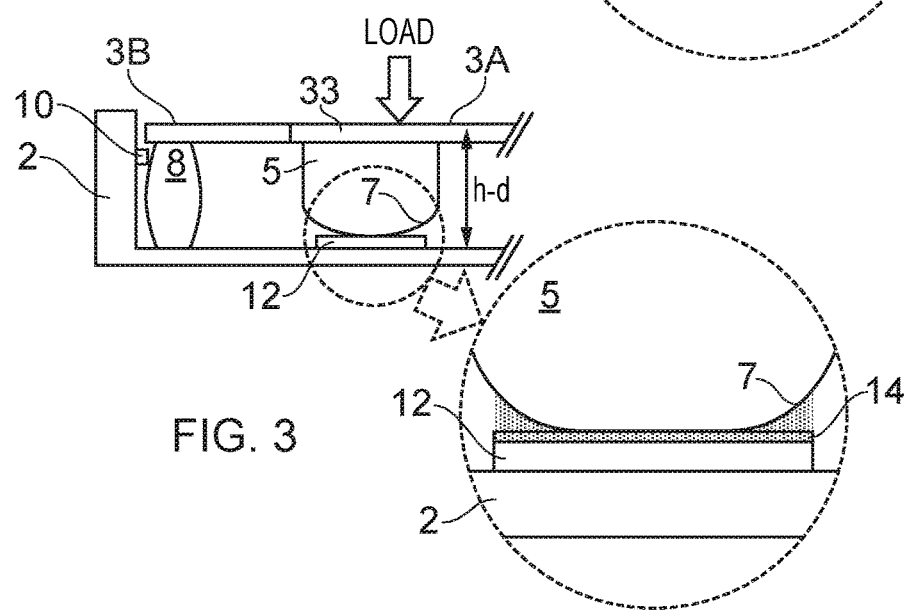
FIG. 3 schematically shows in cross-section a portion of the sensor element of FIG. 1 in a displaced state.

FIGS. 1, 2 and 3 schematically represent various aspects of a sensing apparatus 1 in accordance with certain embodiments of the invention. The sensing apparatus 1 comprises two main functional parts, namely a sensor element 6 and a controller element 4. FIGS. 1, 2 and 3 schematically represent various aspects of a sensing apparatus 1 in accordance with certain embodiments of the invention.

The sensor element 6 comprises a frame or frame element 2, a displaceable element 3 which is mounted with respect to the frame 2 such that the displaceable element 3 (or parts thereof) can be displaced relative to the frame 2 in a displacement direction as described in more detail below, and a plurality of displacement sensing/sensor elements, generally indicated by numerals 5 and 12, provided to sense changes in the displacement of the displaceable element 3 at different locations of the displaceable element 3 with respect to the frame 2.

FIG. 1 schematically represents the sensor element 6 in plan view and the controller element 4 in highly schematic form (i.e. as a functional block). FIGS. 2 and 3 respectively show portions of the sensor element 6 of the sensing apparatus 1 in cross-section (taken on the line A-A represented in FIG. 1), with FIG. 2 showing the sensing apparatus 1 in a non-displaced (rest) state and FIG. 3 shows the sensing apparatus 1 in a displaced state.

The sensing apparatus 1 is arranged to measure displacement of the displaceable element 3 relative to the frame 2, for example in response to a user pressing on or applying a displacement load or loads to the displaceable element 3. Such displacement loads may be applied directly by the user (e.g., by the user's finger) or indirectly (e.g., through a stylus operated by the user). The application of an example load during use, e.g. corresponding to a user pressing a finger on the displaceable element 3, is schematically shown in FIG. 3 by the arrow labelled "LOAD". For ease of explanation, the side of the sensing apparatus 1 to which the load is applied in normal use may sometimes be referred to herein as the "upper" or "outer" side of the sensing apparatus 1 (or similar terminology such as "top"), with the other side being referred to as "lower" or "inner" (or similar terminology, such as "bottom"). Thus, the upper surface of the displaceable element 3 shown uppermost in the orientation of FIGS. 2 and 3 may sometimes be referred to as the upper/outer/top surface of the displaceable element 3. Likewise, the lowermost surface of the displaceable element 3 for the orientation of FIGS. 2 and 3 may sometimes be referred to as the bottom/lower/inner surface. Corresponding terms may similarly be used in respect of other parts of the sensing apparatus 1 in accordance with the orientation shown in the relevant figures. However, it will be appreciated this terminology is used purely for convenience of explanation and is not intended to suggest a particular orientation of the sensing apparatus 1 should be adopted in normal use. For example, although in the orientation of FIGS. 2 and 3 the upper surface of the sensor element 6 is shown uppermost, the sensor element 6 could equally be used in a downward facing configuration or facing outwards from a vertical surface according to the implementation at hand. More generally, the sensing apparatus 1 may be incorporated in a portable device (such as a tablet computer or mobile telephone), and in that case the orientation in use will vary according to how a user happens to be holding the device.

Broadly speaking, the sensing apparatus 1 may be configured to act as a user input device or mechanism and provide an indication that a user input has been received by the sensing apparatus 1 to hardware/software associated with the sensing apparatus 1. The hardware/software associated with the sensing apparatus 1 may then make use of this indication in a suitable manner depending on the specific application at hand. For instance, the hardware/software may be a computer, such as a personal computer, a smartphone/mobile telephone or tablet computer, or an on-board automobile computer, etc. and the indication of the input may be used to operate or otherwise interact with features of the computer. In the present example, the user may be required to displace the displaceable element 3 relative to the frame 2 to signify a user input.

In the present example, the displaceable element 3 comprises a sensing surface 3A. The sensing surface 3A corresponds to a part of the upper surface of the displaceable element 3 and is a surface where a user is intended to perform an input (or more specifically, where the user is expected to press/apply a displacement load on the displaceable element 3). For example, the sensing surface 3A may show/display an icon or image indicating where the user should apply the displacement load to cause a user input to be detected. Surrounding the sensing surface 3A is a part of the upper surface of the displaceable element 3 which is not intended to be pressed by a user to provide the associated input, and is herein referred to as a non-sensing surface 3B. As described in more detail below, the present disclosure provides solutions for distinguishing between a valid input (displacement load) which may correspond to the user pressing on the surface of the displaceable element 3 within the sensing surface 3A and an invalid input (displacement load) which may correspond to the user pressing on the non-sensing surface 3B of the displaceable element 3.

In this example implementation, the displacement sensor elements operate based on measuring changes in capacitive couplings associated with deformable electrodes 5 arranged between the displaceable element 3 and frame 2 and reference electrodes 12. In FIG. 1, four deformable electrodes 5 are positioned at a location corresponding to each corner of the sensing surface 3A of the displaceable element 3 and are contained within the two-dimensional footprint of the sensing surface 3A (when viewed from above as in FIG. 1). The deformable electrodes 5 have an L-shape extending parallel with corresponding sides of the sensing surface 3A. Four reference electrodes 12 having the same shape as the deformable electrodes 5 are positioned below the deformable electrodes 5 to create four pairs of deformable electrodes 5 and reference electrodes 12. Each deformable and reference electrode pair 5, 12 is configured to sense relative displacement of the displaceable element 3 at different locations.

The capacitive couplings between the electrode pairs 5, 12 are measured by the displacement sensor elements measuring circuitry 4B, for example using conventional capacitive measurement techniques. Displacement of the displaceable element 3 relative to the frame 2 causes a change in the capacitive couplings between the deformable electrodes 5 and the reference electrodes 12 as the deformable electrodes 5 deform under application of displacement loads. The displacement sensor elements measuring circuitry 4B is shown schematically in FIG. 1 as a single unit to which all displacement sensor elements 5, 12, are coupled. However, in some implementations, the displacement sensor elements measuring circuitry 4B may comprise multiple units to which one or a plurality of the displacement sensor elements 5, 12, are coupled.

It will be appreciated the specific displacement sensing technology is not significant to the principles described herein and, in other implementations, other types of displacement sensing technology may be used. For example, in some implementations the displaceable element 3 may be configured to press against a plurality of mechanical switches, or optical displacement sensors may be used to measure distances between the frame 2 and displaceable element 3. In general, any sensing technology that is able to provide an indication of physical displacements of different regions of the displaceable element 3 and sensing surface 3A may be adopted.

Additionally, the arrangement of four displacement sensor elements 5, 12 as shown in FIG. 1 is an example arrangement and, depending on the application at hand, a less or greater number of displacement sensor elements 5, 12 may be used. Equally, the particular spatial arrangement of the displacement sensor elements 5, 12 is an example arrangement and the displacement sensor elements 5, 12 may be provided at different locations to that shown in FIG. 1, e.g., closer to the middle of the sensing surface 3A, along the edges of the sensing surface 3A, overlapping the sensing surface 3A and non-sensing surface 3B. It may be advantageous, in order to receive the greatest signal strength, however if the displacement sensor elements 5, 12 are positioned within the footprint of the sensing surface 3A.

In the example shown in FIGS. 1 to 3, the displaceable element 3 further comprises a capacitive sensing element 33. The capacitive sensing element 33 provides a two-dimensional surface on the displaceable element 3 which is configured to sense the presence/absence of an object (such as a human finger or a stylus) and/or a position of the object on or adjacent the two-dimensional surface on the displaceable element 3. In the example shown in FIG. 1, the sensing surface 3A corresponds with the sensing surface provided by the capacitive sensing element 33. That is, the sensing surface 3A is not only the part of the upper surface of the displaceable element 3 where a user is intended to perform an input, but is also the part of the upper surface of the displacement element 3 which is configured to capacitively sense the presence/absence and/or position of an object on the upper surface of the displaceable element 3. A more detail description of the capacitive sensing element 33 is provided later in the description.

Turning back to FIGS. 1 to 3, the frame 2 provides a structural support for the displaceable element 3 and will typically be connected to, or comprise an integral part of, an apparatus in which the sensing apparatus 1 is provided. The frame 2 may comprise any suitable structural material, for example it may be formed from metal or plastic. The frame 2 in this example defines a recess/opening into which the displaceable sensing element 3 is received and moveably supported therein by a support element 8 arranged around a peripheral part of the displaceable element 3. In this example, the movable mounting of the displaceable element 3 relative to the frame 2 is provided by virtue of the support element 8 comprising a resiliently compressible material (see FIGS. 2 and 3 in particular). An upper edge of the support element 8 is bonded to the underside of the displaceable element 3 and a lower edge of the support element 8 is bonded to the frame 2. Conventional bonding techniques can be used for bonding the support element 8 to the other parts of the sensing apparatus 1, for example having regard to bonding techniques appropriate for the materials involved.

The support element 8 in this example is thus generally in the form of a rectangular ring arranged around a peripheral part of the displaceable element 3. The support element 8 has a generally rectangular cross-section when in its relaxed state (as shown in FIG. 2), although when the support element 8 is compressed by virtue of one or more loads being applied to the capacitive sensing element 3, its sides may bow out to accommodate the movement, as schematically indicated in FIG. 3. It will, however, be appreciated that other shapes could be used in accordance with established mounting practices. For example, more complex shapes for the support element 8 may be chosen to provide different degrees of compressibility according to the degree to which the support element is already compressed. The support element 8, as opposed to being a continuous rectangular ring, may instead be a series of discrete elements, and may take any suitable arrangement as deemed suitable for a particular sensing apparatus 1.

The displaceable element 3 may be provided with a stop 10 to limit the extent to which the support element 8 may be compressed (i.e. to limit the extent to which the displaceable element 3 may be displaced relative to the frame element 2). In this example, such a stop is provided by a suitably arranged protrusion 10 from a side wall of the recess defined by the frame element 2. This protrusion 10 may extend all around the recess or may be provided at a number of discrete locations around the recess.

The support element 8 in this example comprises an elastomeric material having an appropriate degree of rigidity and compressibility according to the application at hand (i.e. providing a desired level of resistance to compression). In some cases there may be a desire for a material having relatively low compressibility, thereby requiring a relatively high load to generate a given displacement of the displaceable element 3 relative to the frame element 2. Conversely, in some cases there may be a desire for a material having relatively high compressibility, thereby requiring a relatively low load to generate a given displacement of the displaceable element 3 relative to the frame element 2. This will be a question of design choice. For example, in the context of the sensor element 6 forming a user interface, a designer may choose how hard the user must press to cause a given displacement. This may be done, for example, to balance the risk of accidental activation against requiring too great a force for activation. A material having the desired degree of compressibility may be selected from modelling or empirical testing, for example.

With reference to FIGS. 2 and 3, the deformable electrodes 5 are arranged between the displaceable element 3 and the frame 2. The electrodes 5 are arranged in a generally rectangular path around (i.e. within and adjacent to) a peripheral region of the displaceable element 3. Each of the deformable electrodes 5 have a generally "D" shaped cross-section with a lower curved wall 7, which may also be referred to as a contact surface 7 for the deformable electrode 5. The specific geometry of the deformable electrodes 5, e.g. in terms of their cross-sectional size, separation from the peripheral edge of the displaceable element 3, and the extent to which they extend around the whole periphery, is not significant to the principles described herein and may vary depending on the specific construction of the sensing apparatus 1.

The deformable electrodes 5 may be formed in a number of different ways. In this example the deformable electrodes 5 comprise a suitably profiled elastomeric conductive foam; however, other materials may also be used. Electrical connections to the separate deformable electrodes 5 allows for separate measurements of the changes in displacements of the different regions of the sensing surface 3A to be made using one or more conductors in contact with the deformable electrodes 5.

Between the deformable electrodes 5 and the frame 2 are the reference electrodes 12. The reference electrodes 12 are generally provided in alignment with a respective deformable electrode 5 and follow a corresponding path beneath the deformable electrode 5. An upper surface of the reference electrode 12 is provided with an electrical insulator layer 14 (shown schematically in the magnified parts of FIGS. 2 and 3). The insulator layer 14 prevents the overlying deformable electrode 5 from coming into direct electrical contact with the reference electrode 12 when the deformable electrode 12 is pressed against the reference electrode 12 during displacement of the capacitive sensing element 3 towards the frame 2.

The reference electrodes 12 may be provided in a number of different ways, for example as a conductive trace deposited on the frame 2. The insulator layer 14 may also be provided in a conventional manner, for example comprising a plastic film or layer of plastic/resin encapsulant over the reference electrode 12. It will, however, be appreciated that different techniques can be used in different implementations. Although the reference electrode 12 is schematically represented in FIGS. 2 and 3 as being disposed on top of the frame 2, in other examples the reference electrode may be embedded within the frame 2. If the frame 2 is conductive, the reference electrode 12 may be insulated therefrom. It will be appreciated the reference electrode 12 and insulator layer 14 might typically be relatively thin compared to the other elements of the sensor element 6 shown in FIGS. 2 and 3, but these FIGS. are not drawn to scale with the reference electrode 12 (and its layer of insulation 14) shown with exaggerated thickness in the cross-sections of FIGS. 2 and 3 for ease of representation.

As noted above, FIG. 2 schematically represents the sensor element 6 in a rest state with no displacement loads applied to the displaceable element 3. In this example the gap between the upper surface of the frame element 2 and a lower surface of the displaceable element 3 is, as indicated in FIG. 2, h. This gap h corresponds with the height of the support element 8 in its relaxed state. In this example the support element 8 is sized to provide a gap h that is slightly less than the height of the deformable electrodes 5, such that the deformable electrodes 5 are in slight compression so there is a portion of the contact surfaces 7 for which there is no free space (air gap) between the deformable electrodes 5 and the frame 2, even when in the rest (non-displaced) state.

FIG. 3 schematically represents the sensor element 6 in a displaced state in which a displacement load is applied to the displaceable element 3 by an object, and more specifically in which the displacement load is applied to the sensing surface 3A. The displacement load may, for example, be provided by a user's finger pressing on the outer surface of the displaceable element 3 or by a non-biological object such as a stylus. The support element 8 and the deformable electrode 5 are both compressed under the action of the displacement load allowing the displaceable element 3 to move along a displacement direction towards the frame 2 by an amount d. The magnitude of the displacement d will depend at least on the force (load) applied and the combined resilience of the support element 8 and the corresponding deformable electrode 5. The displaceable element 3 in FIG. 3 is schematically shown as remaining parallel to the frame when displaced, but in general it may be expected the displacement element 3 may be tilted depending on the location of the load (i.e. the value of d may be different at different positions across the displacement element 3). In some instances, the displaceable element 3 may be formed from a material having some degree of flexibility, such that the degree of displacement is not linear across the whole displacement element 3. In this example, the magnitude of the displacement may be on the order of around 0.1 cm.

As a consequence of the deformable electrode 5 being squashed under the displacement load, the curved contact surface 7 is pressed harder against the underlying insulator layer 14. This causes the contact surface 7 to flatten against the insulator layer 14, thereby reducing the overall volume between the deformable electrode 5 and the reference electrode 12 as compared to the rest state represented in FIG. 2. The space between the deformable electrode 5 and the reference electrode 12 is schematically shown with shading in FIGS. 2 and 3, and it can be seen how the shading in FIG. 3 occupies a smaller area than the shading in FIG. 2.

Because the volume of the space between the deformable electrode 5 and the reference electrode 12 is reduced under the displacement load, the capacitive coupling between the deformable electrode 5 and the reference electrode 12 increases when the displacement load is applied. The controller element 4, and in particular the displacement sensing element measuring circuitry 4B, is configured to measure a characteristic of the capacitive coupling associated with the two electrodes 5, 12, to thereby output an indication of the relative displacements of the sensing surface 3A of the displaceable element 3. Connections between the displacement measuring circuitry 4B and the respective electrodes can be established in accordance with conventional techniques, for example using appropriate wiring. There are various different ways in which a characteristic of the capacitive coupling between the two electrodes can be measured. For example, the mutual capacitive coupling between the two electrodes could be measured by applying a drive signal to one of the electrodes and measuring the extent to which the drive signal is coupled to the other of the electrodes. Alternatively, the self-capacitance of one of the electrodes could be measured with respect to a reference potential whilst the other electrode is connected to the reference potential (e.g. a system ground or other system reference potential). For simplicity the system reference potential may sometimes be referred to herein as a system ground or earth, but it will be appreciated the actual potential itself may be arbitrary and is not significant (e.g. it could be 0V, 5V or 12V, or any other value according to the implementation at hand). In yet another example, one of the electrodes may comprise two components which are capacitively coupled to one another. For example the reference electrode 12 of FIGS. 1 to 3 may be replaced with a reference electrode comprising a pair of parallel or interdigitated conductors which are insulated from one another but in a relatively close proximity on the frame 2, with the gap between them underlying the deformable electrode 5. The mutual capacitive coupling between the two conductors comprising the reference electrode could be measured by applying a drive signal to one of the conductors and measuring the extent to which the drive signal is coupled to the other of the conductors. The component of the drive signal coupled between the electrodes will generally be reduced as the overlying deformable electrode is compressed on to them under the displacement load. Nonetheless, it will be appreciated the specific capacitive sensing technology used to detect changes in the capacitive coupling between the deformable electrode 5 and the reference electrode 12 is not significant to the principles described herein. In general, the sensing apparatus 1 is able to detect the displacement of different regions of the sensing surface 3A, and this may be detected using any known displacement sensing technology.

As described above, the sensing apparatus 1 of the present disclosure is able to discriminate between displacement loads applied at the sensing surface 3A and displacement loads applied at the non-sensing surface 3B.

Figure 4A:
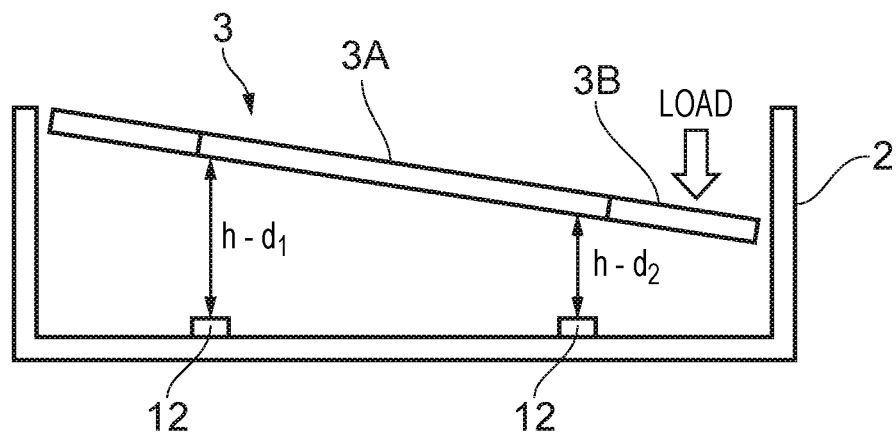
FIGS. 4A and 4B schematically shows, in cross-section, the displacement of the displaceable element of FIGS. 1 to 3 when a displacement load is applied at two different locations on the surface of the displaceable element.
Figure 4B:
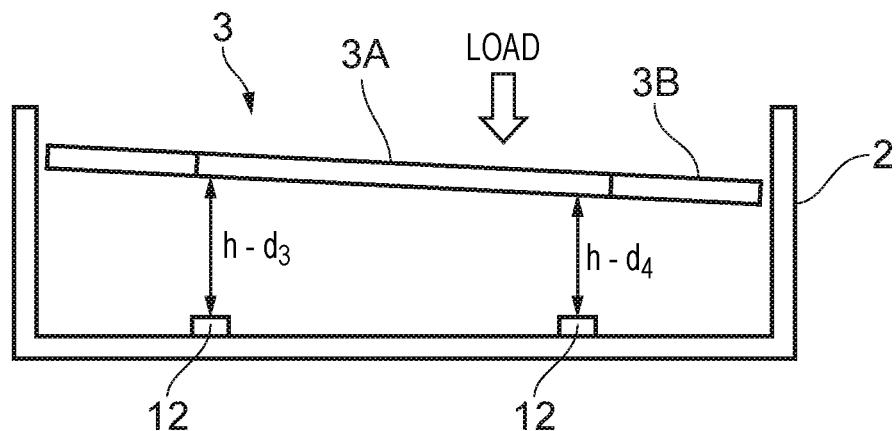

FIGS. 4A and 4B show two example scenarios corresponding to displacement loads applied at different positions on the upper surface of the displaceable element 3. FIGS. 4A and 4B show, schematically, the frame 2 and displaceable element 3 displaced as a result of a load applied at the non-sensing surface 3B (FIG. 4A) and a load applied at the sensing surface 3A (FIG. 4B). Most of the details shown in FIGS. 1 to 3 have been omitted from FIGS. 4A and 4B for clarity. Additionally, two reference electrodes 12 are shown in FIGS. 4A and 4B, primarily to symbolise the relative locations at which the displacement of the displaceable element 3 is measured in the example scenarios of FIGS. 4A to 4B.

Turning to FIG. 4A, the displacement load is applied to the non-sensing surface 3B of the displaceable element 3, and in particular to the right-hand side of the displaceable element 3 as represented by the arrow labelled "LOAD" (as seen in FIG. 4A). The displacement load causes the displaceable element 3 to tilt such that the right-hand side of the displaceable element 3 is closer to the base of the frame 2 than the left-hand side of the displaceable element 3. In this instance, the two displacement sensors (the shown reference electrodes 12 and the not-shown deformable electrodes 5) output signals (e.g., values of the capacitance) indicative of the distances between the displaceable element 3 and the frame 2 as h-d1 and h-d2 respectively, as shown in FIG. 4A. As should be readily apparent, d2 (corresponding to the displacement of the displaceable element 3 as measured at a measurement position of the displaceable element 3 which is relatively closer to the position the displacement load is applied) is significantly greater than d1.

In FIG. 4B, the displacement load is instead applied to the sensing surface 3A of the displaceable element 3, and in particular to the right-hand side of the sensing surface 3A as represented by the arrow labelled "LOAD" (as seen in FIG. 4B). The displacement load causes the displaceable element 3 to displace and slightly tilt such that the right-hand side of the displaceable element 3 is only slightly closer to the base of the frame 2 than the left-hand side of the displaceable element 3. In this instance, the two displacement sensors (the shown reference electrodes 12 and the not-shown deformable electrodes 5) output signals indicative of the distances between the displaceable element 3 and the frame 2 as h-d3 and h-d4 respectively, as shown in FIG. 4B. As should be readily apparent, d4 (corresponding to the displacement of the displaceable element 3 as measured at a measurement position of the displaceable element 3 which is relatively closer to the position the displacement load is applied) is only slightly greater than d3.

Accordingly, taking the above two scenarios, it can be seen that the ratio of d1:d2 is different (specifically, smaller) to the ratio d3:d4 (or alternatively, it can be said that the ratio d2:d1 is greater than the ratio d4:d3). Hence, it can be determined/estimated from the ratio of the sensed displacements measured by at least two displacement sensor elements (or a pair of displacement sensor elements) whether the displacement load is applied at the sensing surface 3A or at the non-sensing surface 3B.

In accordance with the present disclosure, the controller 4 (and more specifically, the processing circuitry 4C) is configured to determine whether displacement of the displaceable element 3 is a valid displacement (that is, a displacement corresponding to a user input applied at the sensing surface 3A) by comparing the ratio between the displacement sensor element output signals (or a derivable quantity therefrom, such as the displacement d) from a pair of the plurality of displacement sensors to one or more expected ratios for the pair of displacement sensor elements 5, 12. When the measured ratio of the output signals for a pair of displacement sensor elements corresponds to an expected ratio for that pair of displacement sensor elements, then the processing circuitry 4C may determine that the displacement is valid (that is, the displacement of the displaceable element 3 corresponds to a user input applied at the sensing surface 3A). In some implementations, the processing circuitry 4C may determine that, when the ratio of the output signals for a pair of displacement sensor elements does not correspond to an expected ratio for that pair of displacement sensor elements, then the displacement is invalid (that is, the displacement of the displaceable element 3 corresponds to a user input applied at the non-sensing surface 3B).

The expected ratios may be determined in advance by mathematical modelling or empirically. The expected ratios for a given pair of displacement sensor elements may correspond to either a single ratio having a tolerance associated with the ratio, or may be defined by upper and lower ratios defining end points of a range. In the former case, each single ratio may have its own unique tolerance (e.g., if the measured ratio is within 10% of the single ratio, then the processing circuitry 4C determines the displacement is valid), or the single ratio for each pair of displacement sensor elements may have a common tolerance which is applied to all ratios for a given system. In the latter case, end points of the range of expected ratios for a given pair of displacement sensor elements may be defined. In the scenario described by the example arrangement of FIG. 4B, if one assumes that the ratio of d3:d4 is 1:2 then, by virtue of the symmetry of the system, the ratio of d3:d4 for a similar displacement load applied at a similar relative position but on the left-hand side of the sensing surface 3A may be 2:1. Because it is likely that a similar displacement load applied closer to the mid-point between the two displacement sensor elements represented by reference electrodes 12 in FIG. 4B would reduce the difference between the respective displacement sensor element output signals (and indeed a displacement load applied at the mid-point would likely cause a ratio of d3:d4 to be 1:1), and assuming the load is applied at the edge of the sensing surface 3A, the ratios 1:2 and 2:1 represent "limits" on the acceptable ratios for the two displacement sensor elements. In this example, any ratio of the pair of displacement sensor element output signals falling within this range (i.e., having a ratio between 1:2 and 2:1) would be considered a valid displacement. For ratios outside of this range, these may correspond to scenarios such as those shown in FIG. 4A corresponding to the load being applied outside of the sensing surface 3A. Thus, in this example, the one or more expected ratios for the pair of displacement sensor element output signals would be any ratio between the limits 1:2 and 2:1 and, assuming the measured ratio of the pair of displacement sensor element output signals fell within this range, the processing circuitry 4C would determine that the displacement is valid and corresponds to a displacement load applied at the sensing surface 3A.

In practical terms, the displaceable element 3 of the sensing apparatus 1 of FIGS. 1 to 3 has an upper surface that extends in two-dimensions and thus the displacement load may be applied anywhere on the two-dimensional surface defined by the displaceable element 3. An applied load therefore has an aspect which may influence the tilt (or generally displacement) of the displaceable element 3 in a first direction (e.g., a horizontal direction in FIG. 1) and an aspect which may influence the tilt of the displaceable element 3 in a second direction (e.g., a vertical direction in FIG. 1).

Figure 5:
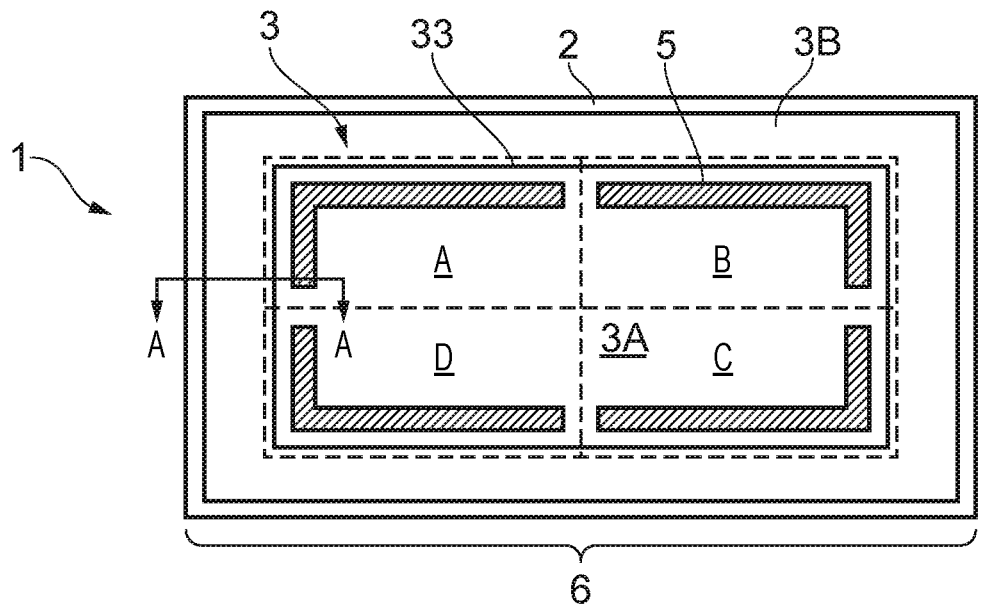
FIG. 5 schematically shows the sensor element of FIG. 1 additionally showing different regions of the sensing surface marked.

FIG. 5 schematically shows, in plan view, the sensor element 6 of FIG. 1 divided into four regions in the plane of the sensing surface 3A. The four regions here correspond to four different locations at which the change in displacement between the displaceable element 3 is to be measured. Each region is shown by the dashed lines and is labelled from A to D, and each region contains one of the four displacement sensor elements 5, 12. Herein, when referring to a specific region, the region shall be reference by the letter given in FIG. 5; for example, the region in the top-left part of FIG. 5 is referred to as "region A". Equally, the displacement sensor output signal from the displacement sensor element(s) in a given region are referred to as the displacement sensor output signals from that region. The regions in FIG. 5 are shown in an enlarged manner and extend beyond the edges of the sensing surface 3A in order to clearly show which part of the sensing surface 3A is being referred to. Additionally, the size/area of the regions may be greater or smaller than that shown depending upon the physical size of the displacement sensor element. Equally, the regions presented in FIG. 5 are merely one example of how the sensing surface 3A can be divided into regions, and hence the regions may be defined differently in both spatial arrangement/size and in number in other implementations.

To determine whether a measured displacement applied at any location on the surface of the displaceable element 3 is valid or not, the processing circuitry 4C may be configured to compare the ratio of displacement sensor element output signals of at least two pairs of displacement sensor elements to expected ratios of the displacement sensor element signal outputs for each of the at least two pairs of displacement sensor elements. For instance, the processing circuitry 4C may be configured to determine that an applied displacement load is valid when the ratio of the displacement sensor element output signals from the displacement sensors element corresponding to region A and region B corresponds to one or more expected ratios for the regions A and B obtained in advance, and when the ratio of the displacement sensor element output signals from the displacement sensor elements corresponding to region A and region D corresponds to one or more expected ratios for the regions A and D obtained in advance.

For example, it may be that for a displacement load applied at the sensing surface 3A within region A, the sensed displacement at region A is roughly twice the displacement at adjacent regions B and D. The displacement sensed at region C may be less than the displacement sensed at regions B and D given that the distance between the displacement sensor elements in regions A and C is greater than the distance between the displacement sensors sensed at regions A and B (or A and D). Accordingly, the ratio of the displacement sensor element output signal at region A (dA) to the displacement sensor element output signal at region B (dB), dA:dB is 2:1, and the ratio of the displacement sensor element output signal at region A to the displacement sensor element output signal at region D (dD), dA:dD is also 2:1. The processing circuitry 4C is configured to determine that the displacement load is a valid displacement load when the ratios of the displacement sensor element output signals for both pairs of displacement sensor elements correspond to one or more expected ratios of the displacement sensor output signals for the respective pairs of displacement sensor elements. In much the same way as described with respect to FIG. 4A, when the displacement load is applied at the non-sensing surface 3B of the displaceable element 3, the ratio of the displacement sensor output signals for a pair of displacement sensor elements may be different to ratios for a displacement load acting on the sensing surface 3A. The processing circuitry 4C may be configured to determine that a displacement load is not a valid displacement load when one or none of the ratios of the displacement sensor element output signals for all pairs of the corresponding displacement sensor elements do not correspond to the one or more expected ratios obtained in advance. That is, the processing circuitry 4C may check each of the expected ratios for pairs of displacement sensor element output signals obtained in advance with the correspondingly obtained displacement sensor element output signals for the corresponding pairs and if none or only one of the ratios of the displacement sensor element output signals for the corresponding pair of displacement sensor elements correspond to the expected ratios, the processing circuitry 4C determines the displacement load is not a valid displacement load (and thus is applied outside of the sensing surface 3A).

Figure 6:
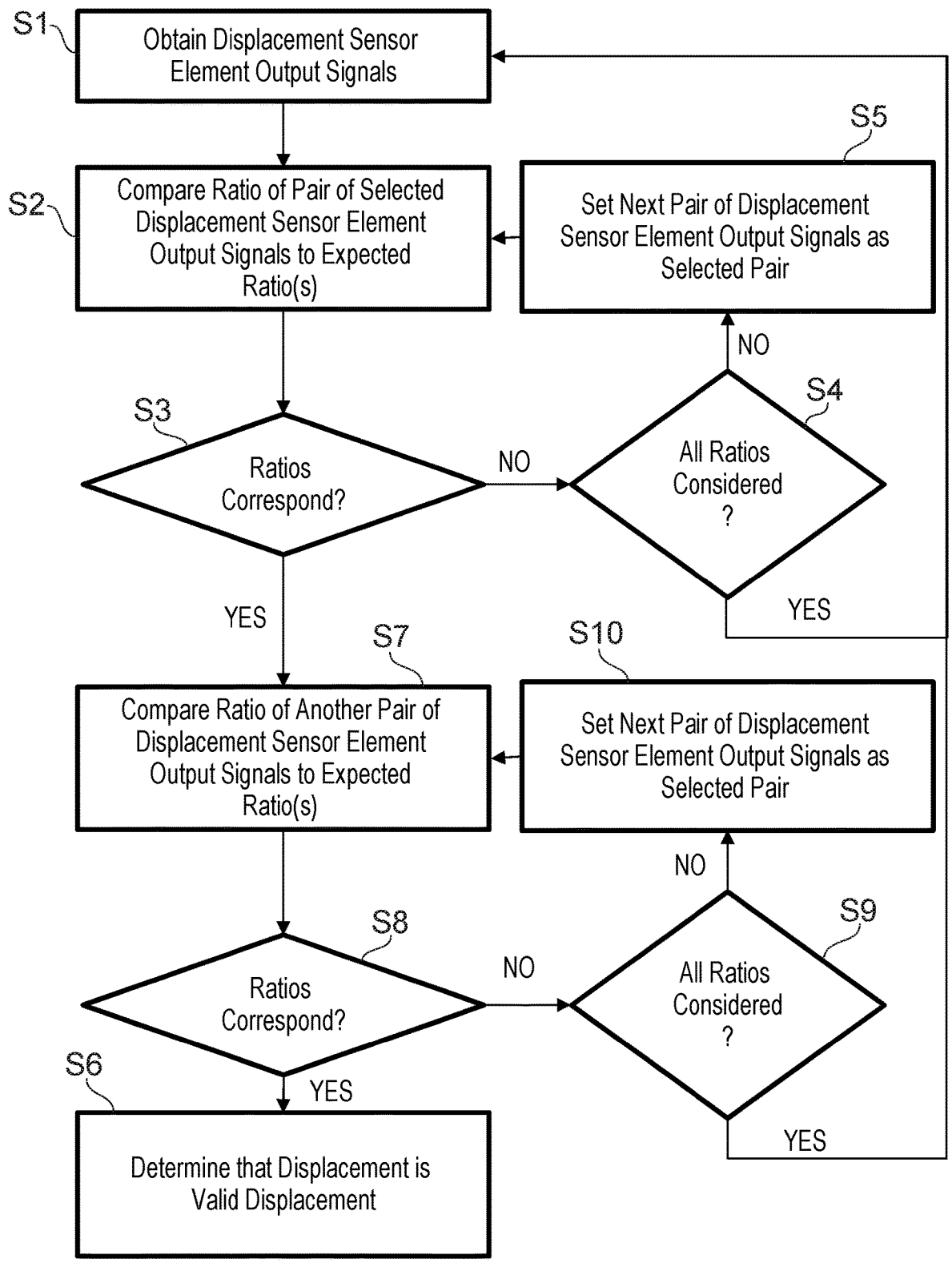
FIG. 6 shows a flow diagram indicating an example method of determining whether a displacement of the displaceable element of FIG. 1 is valid.

FIG. 6 is a flow diagram representing an example method for determining whether a displacement load is a valid displacement load.

The method begins at step S1 where the processing circuitry 4C obtains (via displacement sensing element measuring circuitry 4B) displacement sensor element output signals from each of the displacement sensor elements. As discussed, the displacement sensor element output signals may be a signal indicative of the displacement of the displaceable element 3 relative to the frame 2, for example a capacitance value.

At step S2, the processing circuitry 4C is configured to compare the ratio of any two displacement sensor element output signals to one or more expected ratios for that pair of displacement sensor elements. The processing circuitry 4C may be configured to select the displacement sensor elements according to any suitable algorithm, e.g., the processing circuitry 4C may start with the ratio of displacement sensor element output signal from region A to region B. Thus, as part of step S2, the processing circuitry 4C selects a pair of displacement sensor element output signals, sets this pair as the selected pair, then proceeds to compare the ratio of the displacement sensor element output signals for the selected pair to one or more expected ratios obtained in advance for the selected pair.

At step S3, the processing circuitry 4C determines whether the ratio of the displacement sensor element output signals for the selected pair of displacement sensor elements correspond to one or more expected ratios obtained in advance for the selected pair of displacement sensor elements. The processing circuitry 4C may use a look-up table or the like having the one or more expected ratios of the displacement sensor element output signals for the selected pair of displacement sensor elements, and proceeds to check the one or more expected ratios of the displacement sensor element output signals obtained in advance for the selected pair of displacement sensor elements using the look-up table. The look-up table may be stored in an associated memory of the processing circuitry 4C, for example.

If, at step S3, the ratio of the displacement sensor element output signals for the selected pair does not correspond to one or more expected ratios obtained in advance for the selected pair (i.e., a "NO" at step S3), the method proceeds to step S4 where the processing circuitry determines whether all pairs of displacement sensor element output signals have been considered. For instance, the sensing apparatus may comprise four displacement sensor elements (e.g., as shown in FIG. 1 or 5), thus meaning there are twelve different ratios of the displacement sensor element output signals or six different ratios if one does not include the inverse ratio for combinations of displacement sensor element output signals (e.g., the ratio of the output signals of region D with region A is the inverse of the ratio of the output signals of region A with region D). Hence, as mentioned at step S2, the processing circuitry 4C may have an algorithm or a set sequence in which to consider the different ratios of the displacement sensor element output signals (e.g., the ratios of the output signals for the different regions may be as follows: A:B, A:C, A:D, B:C, B:D, and C:D).

At step S4, the processing circuitry 4C determines whether all ratios have been considered. If so (i.e., "YES" at step S4), the method proceeds to step S1 where the processing circuitry 4C obtains a next set of displacement sensor element output signals (that is, a set of displacement sensor element output signals obtained later in time). Step S1 may be repeated periodically or in response to some external input. Conversely, if all ratios have not been considered at step S4 (i.e., "NO" at step S4), then the method proceeds to step S5 where the processing circuitry 4C sets the next pair of displacement sensor element output signals according to the algorithm or sequence as the selected displacement sensor element output signals and proceeds to process steps S2 and S3 as described above (e.g., this may involve setting the output signals from regions A and C as the selected displacement sensor element output signals).

If, on the other hand, at step S3 the ratio of the displacement sensor element output signals for the selected pair does correspond to one or more expected ratios obtained in advance for the selected pair (i.e., a "YES" at step S3), in one implementation, the method proceeds to step S6.

At step S6, the processing circuitry 4C determines that the displacement load that caused the displacement of the displaceable element 3 constitutes a valid displacement. Accordingly, the processing circuitry 4C may output an indication that displacement has occurred (and in some implementations, also the magnitude of the displacement) to associated hardware and/or software communicatively coupled to the sensing apparatus 1, for example to a computer running an application which uses the indication of displacement as a user input (e.g., to select an option or perform a function).

The method of FIG. 6 may proceed to step S6 from S3 when at step S3 the ratio of the displacement sensor element output signals for the selected pair does correspond to one or more expected ratios obtained in advance for the selected pair when only one pair of the all the obtained displacement sensor element output signals is considered to correspond to one or more of the expected ratios of the displacement sensor element output signals obtained in advance.

However, as discussed in relation to FIG. 5, in some implementations, the processing circuitry 4C may only determine that a displacement is a valid displacement (i.e., applied to the displaceable element 3 within the sensing surface 3A) if two or more pairs of displacement sensor element output signals correspond to one or more expected ratios obtained in advance for the respective pairs of the displacement sensor element output signals obtained in advance. In such an implementation, at step S3, when it is determined the ratio of the displacement sensor element output signals for the selected pair does correspond to one or more expected ratios obtained in advance for the selected pair (i.e., a "YES" at step S3), the method proceeds to step S7.

At step S7, the processing circuitry 4C proceeds to compare another ratio of the displacement sensor element output signals corresponding to a pair of displacement sensor elements that is not the same pair as the select pair of displacement sensor elements. In this regard, if it is found for example that the ratio of the output signals of region A to region C corresponds with one or more expected ratios for the output signals for regions A and C obtained in advance, the processing circuitry 4C at step S7 proceeds to check the ratios of the displacement sensor element output signals for any pair of displacement sensor elements that is not the displacement sensor element of region A and the displacement sensor element of region C. It should be appreciated that the processing circuitry 4C at step S7 may, for example, use the ratio of the output signals of regions A and D as the another ratio of step S7. That is, the another pair of displacement sensor element output signals may comprise one of the displacement sensor element output signals from the selected pair displacement sensor element output signals of step S3. In some implementations, it may be advantageous to only check, or to check first, pairs of displacement sensor element output signals that do have one output signal which has already been confirmed as being part of a ratio that corresponds to one or more expected ratios as it is likely that any displacement will also affect these ratios.

In a similar manner to step S3, at step S8 the processing circuitry 4C determines whether the ratio of the displacement sensor element output signals for the another pair of displacement sensor elements correspond to one or more expected ratios obtained in advance for the another pair of displacement sensor elements. The processing circuitry 4C may use a look-up table or the like, as before.

Similarly, if at step S8, the ratio of the displacement sensor element output signals for the another pair does not correspond to one or more expected ratios obtained in advance for the selected pair (i.e., a "NO" at step S8), the method proceeds to step S9 where the processing circuitry determines whether all pairs of displacement sensor element output signals have been considered (other than the selected pair of displacement sensor element output signals). The processing circuitry 4C may use the same or a different algorithm or set sequence as described in relation to step S3 to check the remaining pairs of displacement sensor element output signals. At step S9, the processing circuitry 4C determines whether all ratios have been considered and, if so (i.e., "YES" at step S9), the method proceeds back to step S1 where the processing circuitry 4C obtains a next set of displacement sensor element output signals (that is, a set of displacement sensor element output signals obtained later in time). Conversely, if all ratios have not been considered at step S9 (i.e., "NO" at step S9), then the method proceeds to step S10 where the processing circuitry 4C sets the next pair of displacement sensor element output signals according to the algorithm or sequence as the pair of another displacement sensor element output signals and proceeds to process steps S7 and S8 as described above.

If, on the other hand, at step S8 the ratio of the displacement sensor element output signals for the another pair does correspond to one or more expected ratios obtained in advance for the another pair (i.e., a "YES" at step S3) the method proceeds to step S6, which is implemented as discussed above.

As should be appreciated, when the processing circuitry is configured to perform steps S2, S3, S7 and S8, the method only proceeds to step S6, and thus determines the displacement is a valid displacement, when a first ratio of a pair of displacement sensor element output signals obtained from a respective first pair of displacement sensor elements correspond to one or more expected ratios of the displacement sensor element output signals obtained in advance for that first pair of displacement sensor elements and a second ratio of a pair of displacement sensor element output signals obtained from a respective second pair of displacement sensor elements correspond to one or more expected ratios of the displacement sensor element output signals obtained in advance for that second pair of displacement sensor elements. This may provide a more reliable method for determining whether the displacement of the displaceable element 3 is valid.

It should be understood that the method of FIG. 6 may be extended to cover implementations which may require three or more ratios of displacement sensor element output signals to correspond to one or more expected ratios, essentially by modifying/duplicating steps S7 to S10 between steps S8 and S6.

Hence, described above is a sensing apparatus having a plurality of displacement sensor elements 5, 12 each providing a displacement sensor output signal indicative of a displacement between the frame 2 and the displaceable element 3 at different spatial locations. Based on the obtained displacement sensor output signals, the processing circuitry 4C is configured to compare the ratio between the displacement sensor output signals from a pair (any pair) of the plurality of displacement sensors to one or more expected ratios for the given pair of displacement sensors obtained in advance. The processing circuitry 4C may determine that the displacement is valid depending on the specific criteria for the implementation at hand. For instance, the processing circuitry may determine that the displacement load is valid when one pair of displacement sensor element output signals corresponds to an associated expected ratio, or the processing circuitry may determine that the displacement load is valid when two pairs of displacement sensor element output signals corresponds to an associated expected ratio.

The arrangement described above may be modified to help improve reliability and accuracy in respect of determining when a displacement load is a valid displacement load.

Figure 7:
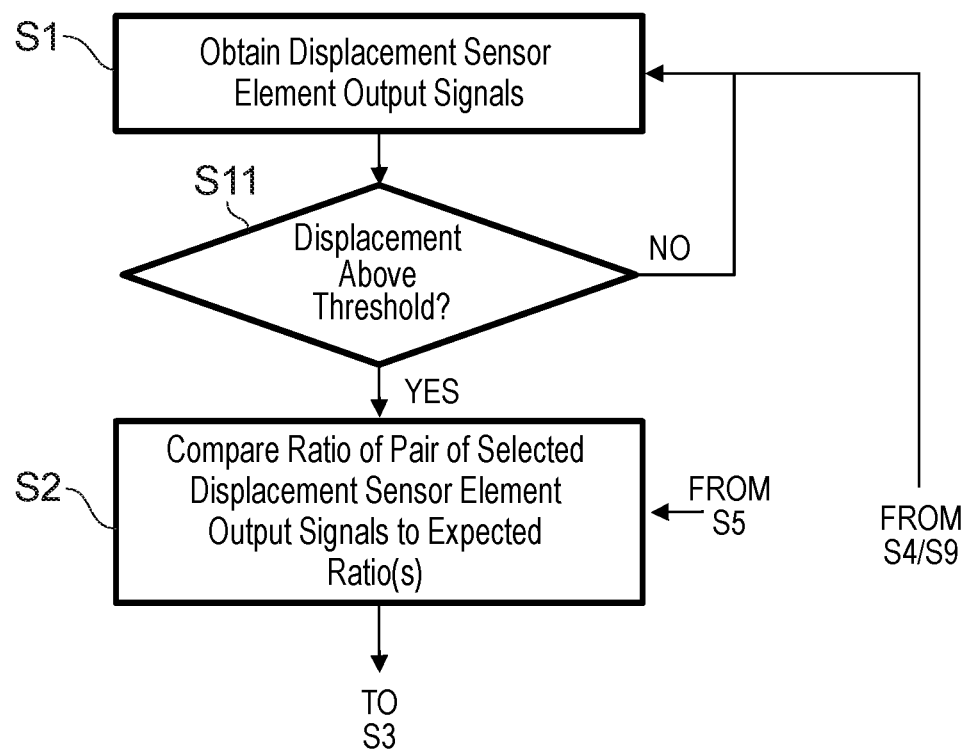
FIG. 7 shows a modification of the method of FIG. 6 to additionally consider whether the displacement of the displaceable element is above a threshold.

In a first modification, the processing circuitry 4C may be configured to determine whether a displacement load is valid only when the displacement sensor element output signal from any of the displacement sensor elements indicates that displacement of the displaceable element 3 has occurred. FIG. 7 shows a modification of a part of the method of FIG. 6.

In FIG. 7, an additional step S11 is provided between steps S1 and S2 of the method of FIG. 6. At step S11, the processing circuitry 4C is configured to determine whether any of the displacement sensor element output signals indicate that the displacement of the displaceable element 3 (that is the quantity, d of FIG. 3) surpasses a threshold, indicating that there has been a certain level of displacement of the displaceable element 3. Accordingly, implementing this step can avoid erroneously reading small displacements (e.g., due to vibrations or the like) as displacements of the displaceable element 3.

In a second modification, the processing circuitry 4C may be configured to identify which displacement sensor element output signal corresponds to the greatest displacement (that is, where d is greatest) and subsequently use that displacement sensor element output signal as one of the signals of a pair of displacement sensor element output signals in steps S2 onwards. For example, as part of step S2, the processing circuitry 4C determines, e.g., that the displacement sensor element output signal from the displacement sensor indicates the greatest displacement is sensed at region A (suggesting, potentially, that the displacement load is applied at or near to region A), then the processing circuitry 4C is configured to compare the ratio of the displacement sensor element output signal of region A and the displacement sensor element output signal of another region at step S2. This may help cut down on processing time and processing resources. Equally, at step S4, the processing circuitry 4C may be configured to only consider ratios which have the displacement sensor element output signal of region A, as opposed to all possible ratios of displacement sensor output signals, given that if no ratio comprising the displacement sensor element output signal of region A corresponds to the one or more expected ratios, then it is likely the displacement is invalid as region A is the strongest source of the displacement.

The above method is described to help discriminate displacement loads that are applied to a displaceable element that occur at or within a sensing surface 3A or at or within a non-sensing surface 3B of the displaceable element 3. The non-sensing surface 3B may be provided as part of a mounting to whatever system the sensing apparatus 1 is mounted to, e.g. a vehicle dashboard. For example, the space to be occupied by the sensing apparatus 1 may be larger than the desired sensing surface 3A (e.g., corresponding to a button that may be pressed by a user). To provide a more aesthetically pleasing finish, rather than having a single square displaceable element surrounded by plastic housing, it may be desirable to have a larger displaceable element having a sensing surface 3A and a non-sensing surface 3B that more seamlessly integrates with the surrounding system, vehicle dashboard. Additionally, and as described with respect to FIG. 8 in more detail, a plurality of sensing surfaces may be provided on a single displaceable element, with each sensing surface representing a separate user input (e.g., each may mimic a particular button/function of the vehicle dashboard). This again may be a more aesthetically pleasing arrangement and/or easier to manufacture and take up less footprint in the vehicle dashboard (instead of having multiple separate frame elements, etc.). The present disclosure is able to discriminate between displacements applied at the sensing surface 3A (or at the non-sensing surface 3B or another, second sensing surface of the displaceable element) to thereby determine whether the displacement as input by the user is a valid displacement.

As described previously, the sensing apparatus of the present disclosure further comprises a touch sensitive element, namely capacitive sensing element 33 that provides a two-dimensional surface on the displaceable element 3 configured to sense the presence/absence of an object (such as a human finger or a stylus) and/or a position of the object on or adjacent the two-dimensional surface on the displaceable element 3.

Turning now to a description of the capacitive coupling/sensing function, the capacitive sensing element 33 is configured to sense the locations of the one or more objects disposed on the sensing surface 3A of the displaceable element 3. The capacitive sensing element 3 may be based on any known design, and may be constructed from a single layer or multiple, stacked layers, e.g., a capacitive sensor layer and a protective cover layer. In any case, the uppermost surface (i.e., the surface furthest from the frame 2 in FIGS. 2 and 3) may be considered to provide the sensing surface 3A adjacent which objects are detected.

The capacitive sensing element 33 includes a number of conductive electrodes or traces positioned through, or on a surface of, the capacitive sensing element 33. These electrodes are electrically connected to the capacitive sensing element measuring circuitry 4A in the controller element 4, which is configured to determine the presence and/or positions of objects adjacent the capacitive sensing element 33 based on sensing a capacitive coupling of the objects with the capacitive sensing element 33. As will be appreciated there are many well-established techniques for capacitively sensing the positions of multiple objects over a two-dimensional sensing surface, and any of these technologies may be adopted for the capacitive coupling/capacitive position sensing function of the sensor element 6. In this regard, the specific pattern of electrodes/traces provided across the sensing surface and the associated capacitance measurement techniques provided by the capacitive sensing element measuring circuitry 4A will depend on the specific sensing technology adopted. As is conventional, the electrodes/traces may be made from any suitable conductive material, such as copper or transparent indium tin oxide (ITO) deposited on a substrate. In one example, the electrodes are arranged in a grid with overlapping horizontal (X) and vertical (Y) electrodes in a well-established configuration for capacitive sensing.

In essence, signalling associated with the capacitive sensing element 33 provides an indication of a degree of capacitive coupling between objects overlying the sensing surface and the electrodes comprising the sensing surface 3A in addition to information on the positions/locations of the objects. The specific nature of the signalling and the manner in which it indicates a degree of capacitive coupling will depend on the sensing technology adopted. The textbook "Capacitive Sensors: Design and Applications" by Larry K. Baxter, August 1996, Wiley-IEEE Press, ISBN: 978-0-7803-5351-0 [1] summarises some of the principles of conventional capacitive sensing techniques that may be used for measuring capacitance characteristics in accordance with various implementations. More generally, and as already noted, any established techniques for determining the positions of the objects on the sensing surface based on a capacitive coupling could be adopted.

One example technique for measuring a degree of capacitive coupling uses so-called mutual capacitance measurement techniques. Mutual capacitance can be measured by applying a time varying drive signal to one electrode (e.g., a horizontal electrode) and measuring the extent to which the drive signal is capacitively coupled to another electrode (e.g., a vertical electrode) using conventional capacitance measurement techniques. The magnitude of the mutual capacitive coupling between the electrodes is influenced by the presence of nearby objects, e.g., human fingers. Changes in mutual capacitance measurements may therefore be considered to represent changes in capacitive couplings between nearby objects and the sensing surface.

Another example technique for measuring a degree of capacitive coupling uses so-called self-capacitance measurement techniques. Self-capacitance can be measured by determining the capacitance of an array of electrodes with respect to a reference potential. For example, the self-capacitance of a rectangular array of electrodes can be individually monitored. Changes in the measured self-capacitance for a particular electrode can be considered to represent a change in capacitive coupling between an object adjacent that particular electrode.

It should be understood that the above discussion sets out only some example ways in which capacitive sensing may be implemented for the capacitive sensing element 33 and it will be appreciated various other established techniques, or combination of established techniques, may be used for different implementations.

The capacitive sensing element 33 in this example is in the form of a planar rectangle, but other shapes may be used. The size of the capacitive sensing element 33 may be chosen according to the implementation at hand to provide the desired area over which a displacement load/force is to be detected. Purely for the sake of a specific example, it will be assumed here the capacitive sensing element 33 has a size of around 30 cm (width)×15 cm (height)×0.3 cm (thickness). The capacitive sensing element 33 (and displaceable element 3) in this example is formed generally of a non-conductive material, for example a glass or plastic material, but includes the conductive electrodes/traces. The capacitive sensing element 33 (and displaceable element 3) may be transparent or opaque according to the application at hand. For example, in some implementations a display screen may be provided below the sensor element 6. In this case the capacitive sensing element 33 (and any parts of the displacement element 3 overlaying the display screen) should be transparent, at least to some extent, to allow a user to see the display screen through the sensor element 6. In other cases there may be a desire from a design perspective to hide what is behind the displaceable element 3 or capacitive sensing element 33 (for example because there is internal wiring or structural elements of an apparatus in which the sensor element 6 is mounted which are not intended to be visible to the user for aesthetic reasons). In this case the capacitive sensing element 33/displaceable element 3 and/or frame 2 may be opaque. In such cases, the sensing surface 3A may include markings or other form of indicia representing certain functions associated with the device in which the sensing apparatus 1 is to be used, e.g., the letters of the alphabet at positions on the capacitive sensing element 33 corresponding to a conventional keyboard's layout.

As noted above, the sensing apparatus 1 also comprises the controller element 4 which includes the capacitive sensing element measuring circuitry 4A, the displacement sensing element measuring circuitry 4B, and the processing circuitry 4C. The controller element 4 thus comprises circuitry which is suitably configured/programmed to provide the functionality described herein using conventional programming/configuration techniques for capacitive sensors. While the capacitive sensing element measuring circuitry 4A, displacement sensing element measuring circuitry 4B, and processing circuitry 4C are schematically shown in FIG. 1 as separate elements for ease of representation, it will be appreciated that the functionality of these components can be provided in various different ways, for example using a single suitably programmed general purpose computer, or field programmable gate array, or suitably configured application-specific integrated circuit(s)/circuitry or using a plurality of discrete circuitry/processing elements for providing different elements of the desired functionality.

In accordance with conventional techniques, the capacitive sensing element measuring circuitry 4A is configured to receive signalling from the capacitive sensing element 33 and to perform processing thereon to establish the presence and/or positions of objects adjacent the sensing surface 3A of the capacitive sensing element 33. The specific processing will depend on the specific arrangement of the conductive electrodes/traces of the capacitive sensing element 33. Depending upon the resolution of the capacitive sensing element 33, there may be multiple detection nodes for each detected object (i.e., multiple measurements of capacitive coupling at different position). The capacitive sensing element measuring circuitry 4A may be configured to interpolate measurements for each sensing node position to provide a single position estimate for each sensed object.

Generally, the capacitive sensing element 33 and capacitive sensing element measuring circuitry 4A inform the processing circuitry 4C when a touch/object is sensed at the sensing surface 3A and, optionally, also its relative location on the sensing surface 3A. In the sensing apparatus 1 as described, the processing circuitry 4C may be configured to only consider that a displacement of displaceable element 3 occurs when at least one touch/object is sensed on the sensing surface 3A. In other words, the processing circuitry 4C may be broadly thought of as determining displacement only when there is a genuine touch/object sensed as, if no touch/object is sensed, it is likely the displacement does not result from a displacement load being applied to the sensing surface 3A of the displaceable element 3.

In systems where both a position of an object/touch is sensed using the capacitive sensing element 33 and the displacement of the displaceable element 3 can be sensed at least in a two-dimensional manner (e.g., as in FIG. 5, where the displacement is sensed at different positions in the X and Y directions), to determine whether a sensed touch/object sensed at the sensing surface 3A applies the displacement load, one can identify the position of the touch/object from the capacitance data and an approximate position at which the displacement load acts on the displaceable element 3 (e.g., using ratios of the displacement sensor elements). When the position from the capacitive sensing element 33 and the estimated position from the displacement sensor elements coincide, then it can be determined that the sensed touch/object applied the displacement load to the displaceable element 3.

However, such an approach cannot reliably be performed in systems in which the displaceable element 3 and/or the arrangement of the displacement sensor elements is not symmetrical, and/or in systems in which there are multiple sensing surfaces 3A on a single displaceable element 3 with at least some of the sensing surfaces 3A being their own independent sensing surfaces 3A. Such apparatuses may be used, for example, in vehicle dashboards where typically the displaceable element may take an unusual shape due to the curvature of the dashboard and/or the components (such as the steering wheel) which take priority in the vehicle. Additionally, having different systems to control different functions may be desirable, at the very least to mimic the current vehicle dashboards.

Figures 8, 10:
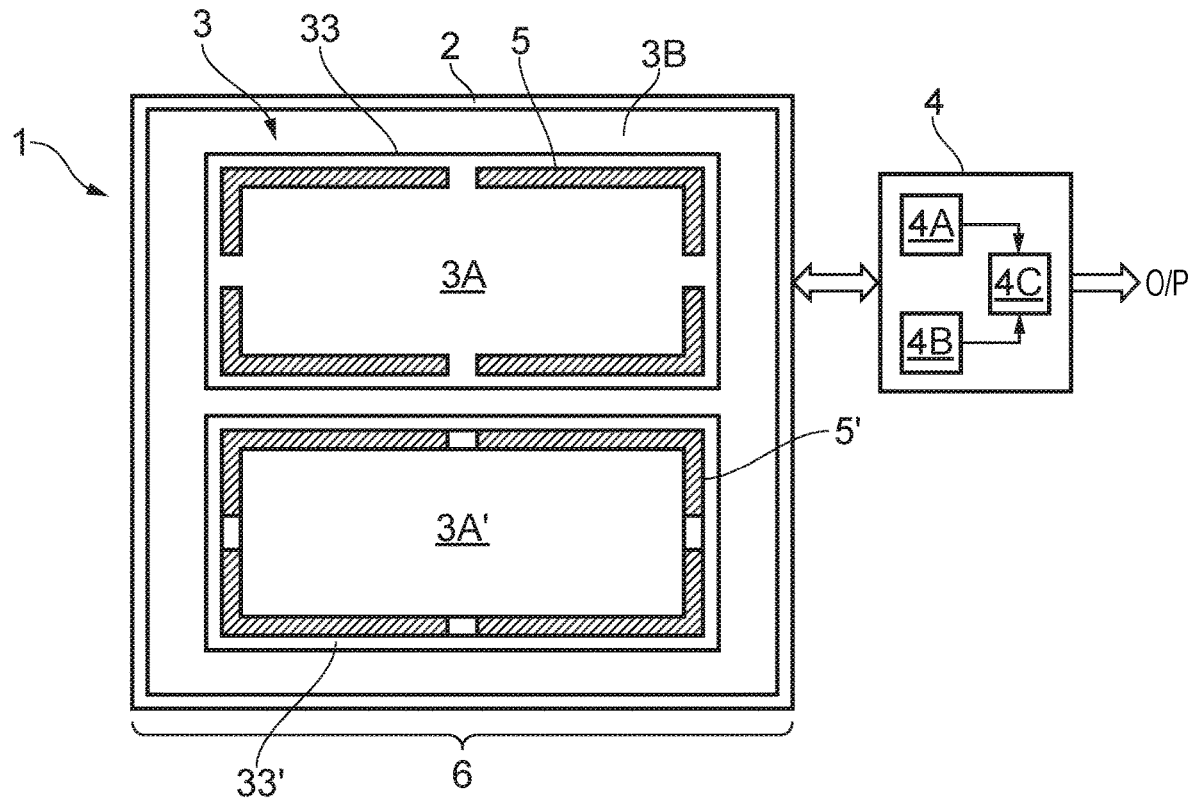
FIG. 8 schematically represents a sensor element and controller element of a sensing apparatus according to certain further embodiment of the invention, where the sensor element comprises two sensing surfaces.
FIG. 10 shows an example table indicating possible touch positions on the sensing surface and associated expected ratios of output signals for different pairs of displacement sensor elements.

FIG. 8 shows an example of such a multi-sensing surface apparatus. The apparatus is identical to FIG. 1 with the exception that the shown displaceable element 3 is larger and includes a second sensing surface 3A' (and associated second capacitive sensing element 33' and associated second set of displacement sensor elements 5'). The first and second sensing surfaces 3A, 3A' may correspond to different displays and may accordingly correspond to regions where different inputs are to be provided by a user (that is, the user may provide a touch/displacement at sensing surface 3A to cause a first function to be performed, while the user may provide a touch/displacement at sensing surface 3A' to cause a second function to be performed. Much like as described in relation to FIGS. 1 and 5, a displacement load applied outside of the sensing surface 3A may cause the displacement sensor elements to sense a change in the displacement.

In such a system, a user may touch the displaceable element 3 at the first sensing surface 3A, but perhaps not to an extent to cause sufficient displacement of the displaceable element 3 (e.g., the user rests their finger/hand on the surface 3A). If the user, or another user, applies a displacement load at a position outside the sensing surface 3A, e.g., at sensing surface 3A', then it may be that displacement of the displaceable element 3 is sensed by the displacement sensor elements 5, 12. Accordingly, the processing element 4C, without any other considerations, may determine that the touch as sensed at the sensing surface 3A applies the displacement load.

Accordingly, the present disclosure is configured to apply the principles discussed above to discriminate between touches/objects that validly apply a displacement load to the displaceable element.

Figure 9:
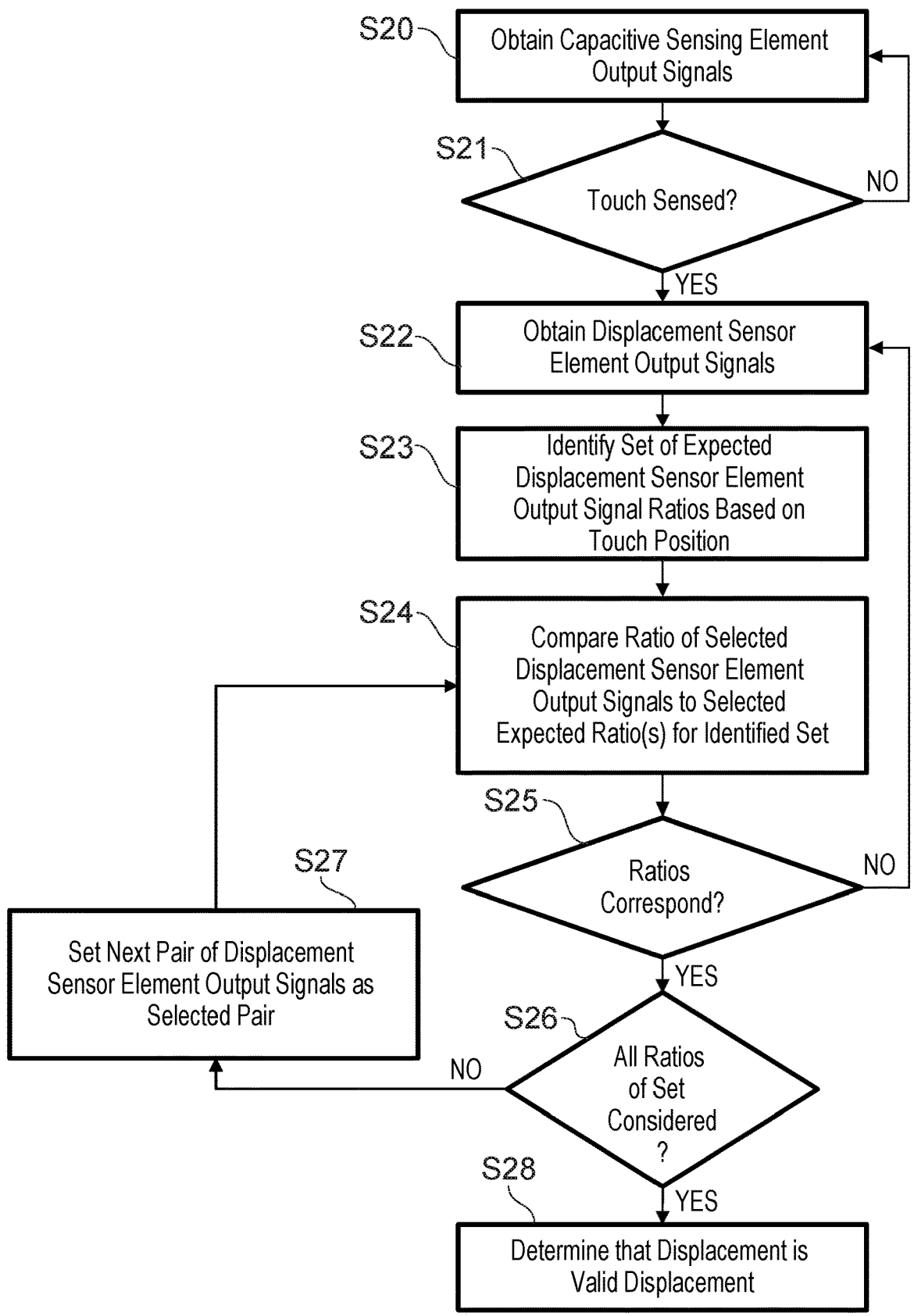
FIG. 9 shows a flow diagram indicating an example method of determining whether a displacement of the displaceable element of FIG. 1 is valid taking into account a position of an object as sensed by a capacitive sensing element of the apparatus of FIG. 1.

FIG. 9 is a flow diagram representing an example method for determining whether a displacement load is a valid displacement load but, unlike FIG. 6, also taking account of the output from the capacitive sensing element 33.

The method of FIG. 9 starts at step S20, where the processing circuitry 4C obtains the capacitive sensing element output signals (e.g., output from the capacitive sensor element measuring circuitry 4A). As described above, this may be a mutual capacitance or a self-capacitance of the various electrodes constituting the capacitive sensor element 33.

At step S21, the processing circuitry 4C determines whether a touch/object is or has been sensed on the basis of the capacitive sensing element output signals, e.g., by comparing the capacitive sensing element output signals to a threshold. As discussed above, the processing circuitry 4C may use any suitable technique for establishing whether a touch/object is sensed using the capacitive sensing element 33.

If no touch/object is deemed to be sensed, i.e., a "NO" at step S21, the method proceeds back to step S20 where a further set of capacitive sensor element output signals are obtained at a later time—for example, the processing circuitry 4C may be configured to periodically obtain the capacitive sensor element output signals from the capacitive sensing element 33.

If, on the other hand, a touch/object is deemed to be sensed at the sensing surface 3A, i.e., a "YES" at step S21, the method proceeds to step S22 (or optionally via step S11 of FIG. 7 first). Step S22 of FIG. 9 is broadly the same as step S1 of FIG. 6 and is not described further for conciseness.

After step S22, the method proceeds to step S23. Step S23 involves the processing circuitry 4C identifying a set of expected ratios of the displacement sensor element output signals for one or more pairs of the displacement sensor elements based on the identified touch position.

For example, the processing circuitry 4C may have access to a look-up table listing pairs of X, Y co-ordinates corresponding to different positions on the sensing surface 3A, and against these co-ordinates one or more expected ratio(s) of the displacement sensor element output signals for corresponding pairs of displacement sensor elements.

FIG. 10 shows an example table listing some example values of the expected ratios for several X, Y co-ordinates of positions on the sensing surface 3A, where 0, 0 represents the position on the bottom left-hand corner of the sensing surface 3A as viewed on FIG. 8 and 2, 0 is the bottom right-hand corner of the sensing surface 3A as viewed on FIG. 8. In each row of the table is listed the expected ratios of displacement sensor element output signals for a given pair of displacement sensor elements. In FIG. 10, for ease of reference, these are based on the regions shown in FIG. 5; that is, "Ratio A:B" should be understood to correspond to the expected ratio between the displacement sensor element output signal at region A to the displacement sensor element output signal at region B. Additionally, each row of the table corresponds to a given X, Y coordinate on the sensing surface 3A.

Accordingly, at step S22, based on the touch position, the processing circuitry 4C identifies a set of expected ratios of displacement sensor element output signals for the displacement sensor elements. E.g., from FIG. 10, for a touch position of 1, 0, the processing circuitry identifies that the expected ratio for the displacement sensor output signals from region A to region B is 1:2, the expected ratio for the displacement sensor output signals from region A to region C is 2:3, etc. The values shown in FIG. 10 are examples only and presented just to demonstrate the principles of the present disclosure. Also, it should be appreciated that for a given touch position, not all of the signals from each of the displacement sensor elements needs to be considered. For example, if a touch is applied at position 0, 2 (e.g., corresponding to the top left-hand corner, i.e., in region A) then the ratio of expected output signals between regions A and C may not be necessary, and the determination may be made only on the ratios of expected output signals between regions A and B and A and D.

Additionally, in some implementations, the look-up table may not include entries for all possible X, Y co-ordinates which could correspond to a touch that is detectable by the capacitive sensing element 33. That is, for example, the capacitive sensor element 33 may be configured to detect positions on the sensing surface 3A with a much finer degree of accuracy (e.g., at a resolution of 0.1). A sensed touch position having co-ordinates 0.5, 0.5 does not have a corresponding row in the table shown in FIG. 10. Therefore, in some implementations, the processing circuitry 4C may be configured to interpolate between relevant available entries in the table (e.g., between 0, 0; 1, 0; 0, 1; and 1, 1). The processing circuitry 4C may therefore determine/calculate expected ratios based on the expected ratios.

The look-up table itself may be determined empirically, e.g., during a calibration process during manufacture, or may be determined mathematically using suitable mathematical modelling.

Once the processing circuitry 4C has identified the set of expected ratios of displacement sensor element output signals, the method proceeds to step S24. At step S24, the processing circuitry 4C selects the measured displacement sensor element output signals for a pair of displacement sensor elements corresponding to the displacement sensor elements that are used to determine a corresponding expected ratio of the displacement sensor output signals. In other words, if the identified set of expected ratios comprises the ratio A:B (signifying the expected ratio of the displacement sensor element output signal at region A to the displacement sensor element output signal at region B), the processing element selects the measured displacement sensor element output signals for regions A and B accordingly. These displacement sensor element output signals are termed the "Selected Pair" of displacement sensor element output signals.

At step S25, the processing circuitry 4C determines whether the ratio of the displacement sensor output signals for the selected pair of displacement sensor elements corresponds to the expected ratio of the displacement sensor output signals for the selected pair of displacement sensor elements.

If, at step S25, the ratio of the displacement sensor output signals for the selected pair of displacement sensor elements does not correspond to the expected ratio of the displacement sensor output signals for the selected pair of displacement sensor elements (i.e., a "NO" at step S25), then the method proceeds back to step S22. In this case, the ratio of the displacement sensor element output signals do not indicate that the sensed displacement is valid for the identified touch position. In other words, the touch/object sensed at the touch position did not apply the displacement load.

If, at step S25, the ratio of the displacement sensor output signals for the selected pair of displacement sensor elements does correspond to the expected ratio of the displacement sensor output signals for the selected pair of displacement sensor elements (i.e., a "YES" at step S25, then the method proceeds to step S26.

At step S26, the processing circuitry 4C determines whether all of the expected ratios of the identified set of expected ratios of displacement sensor element output signals have been considered. If all the expected ratios have not been considered (i.e., a "NO" at step S26), the method proceeds to step S27. Here, the processing circuitry 4C sets the next pair of displacement sensor element output signals as the selected pair and performs the method steps S24 to S26 until all the ratios of the displacement sensor output signals corresponding to the set of expected displacement sensor output signals for the identified touch location have been assessed.

Assuming all of the expected ratios of the set are considered at step S26 (i.e., a "YES" at step S26), then the method proceeds to step S28 where the processing circuitry 4C determines that the displacement is a valid displacement. In this regard, the displacement is not only valid in the sense that it was applied at a position on the sensing surface 3A but also that it is valid in the sense that it is the sensed touch on the sensing surface 3A that applied the displacement load.

Accordingly, the method described above takes into account a sensed touch position and identifies whether ratios of the displacement sensor element output signals indicate that it was the sensed touch that applied a displacement load to the displaceable element 3. As described above, in the context of FIG. 8, if a user or another user applies a touch at the sensing surface 3A' while a user touches the sensing surface 3A, the apparatus is configured to distinguish that the displacement was not applied by the touch located at the sensing surface 3A. Accordingly, in a multi-sensing surface apparatus, displacements applied at locations not corresponding to the sensing surface in question may not be erroneously processed as displacements at the sensing surface in question, thus leading to a more reliable sensing apparatus.

Thus there has been described a sensing apparatus having a frame element and a displaceable element mounted relative to the frame element. The sensing apparatus comprises a plurality of displacement sensor elements each configured to provide a displacement sensor output signal indicative of a displacement between the frame element and the displaceable element, wherein the plurality of displacement sensor elements are arranged at different spatial locations relative to the displaceable element and configured to provide a displacement sensor output signal indicative of a displacement between the frame element and the displaceable element at the respective spatial location. The sensing apparatus further comprises processing circuitry configured to obtain the displacement sensor output signals from the plurality of displacement sensor elements and determine whether displacement of the displaceable element is a valid displacement by comparing at least the ratio between the displacement sensor output signals from a pair of the plurality of displacement sensor elements to one or more expected ratios for the pair of displacement sensor elements obtained in advance. Also disclosed is a device comprising the sensing apparatus, and a method for determining whether a displacement applied to a displaceable element mounted relative to a frame element is a valid displacement.

It will be further appreciated that while specific materials and dimensions for various elements have been provided by way of specific example, in general the materials and overall geometry of the elements comprising the sensing apparatus may be selected according to the application at hand, for example, where a large or small area sensing surface is desired. The exact arrangement adopted for any specific information may be determined empirically, for example by testing the response of different configurations and selecting a configuration providing a desired response (for example in terms of sensitivity/rejection of spurious displacement detections). It will be further realised that while the above descriptions have focussed on a generally planar sensing element 6, the principles described herein are equally applicable to non-planar structures. For example, the same principles could be used to sense objects on a touch sensitive system that incorporates a curved outer surface.

The sensing apparatus generally includes a microprocessor or suitable processing logic, to allow it to filter and adjust the raw measurements from the displacement sensor. This processing function may include calibration to store a displacement "baseline" at initial power-on or on reset/host command. It may also include measurement trimming to compensate for environmental changes that affect the sensor's raw signals, making them drift over time.

The controller element may be configured to make measurements of the relevant capacitive characteristic of the electrodes at an appropriate sampling rate having regard to the timescales on which the displacement is to be measured are expected to occur. For example, in the case of a user interface the sampling rate may correspond with that typically used for user input devices (e.g. corresponding to the rate at which the state of a mouse click button would be sampled).

Further particular and preferred aspects of the present invention are set out in the accompanying independent and dependent claims. It will be appreciated that features of the dependent claims may be combined with features of the independent claims in combinations other than those explicitly set out in the claims.

REFERENCES

[1] Capacitive Sensors: Design and Applications by Larry K. Baxter, August 1996, Wiley-IEEE Press, ISBN: 978-0-7803-5351-0

What is claimed is:

1. A sensing apparatus comprising:
a frame element and a displaceable element mounted relative to the frame element wherein the displaceable element comprises a sensing surface and a surrounding non-sensing surface, and wherein the displaceable element is configured to move along a displacement direction towards the frame element under application of a displacement load to the displaceable element by an object;
a plurality of displacement sensor elements each configured to provide a displacement sensor output signal indicative of a displacement between the frame element and the displaceable element, wherein the plurality of displacement sensor elements are arranged at different spatial locations relative to the displaceable element and configured to provide a displacement sensor output signal indicative of a displacement between the frame element and the displaceable element at the respective spatial location; and
processing circuitry configured to obtain the displacement sensor output signals from the plurality of displacement sensor elements and determine whether displacement of the displaceable element is a valid displacement by comparing at least the ratio between the displacement sensor output signals from a pair of the plurality of displacement sensor elements to one or more expected ratios for the pair of displacement sensor elements obtained in advance, wherein a valid displacement corresponds to a displacement load applied within the sensing surface of the displaceable element.

2. The sensing apparatus of claim 1, wherein the processing element is configured to determine the displacement of the displaceable element is valid when at least the ratio between the displacement sensor element output signals from the pair of the displacement sensor elements corresponds to one or more expected ratios for the pair of displacement sensor elements obtained in advance.

3. The sensing apparatus of claim 2, wherein the ratio between the displacement sensor output signals from the pair of displacement sensor elements corresponding to one or more expected ratios for the pair of displacement sensor elements obtained in advance includes the ratio between the displacement sensor element output signals from the pair of displacement sensor elements corresponding to an expected ratio within a predetermined range of the expected ratio.

4. The sensing apparatus of claim 1, wherein the pair of plurality of displacement sensor elements are a first pair of the plurality of displacement sensor elements, and wherein the processing element is configured to determine whether the displacement of the displacement of the displaceable element is valid based on comparing the ratio between the displacement sensor output signals from the first pair of the plurality of displacement sensor elements to one or more expected ratios for the first pair of displacement sensor elements obtained in advance and based on comparing the ratio between the displacement sensor output signals from a second pair of the plurality of displacement sensor elements to one or more expected ratios for the second pair of displacement sensor elements obtained in advance.

5. The sensing apparatus of claim 4, wherein the at least one displacement sensor element of the first pair of the plurality of displacement sensor elements and the second pair of the plurality of displacement sensor elements is different.

6. The sensing apparatus of claim 1, wherein the processing element is further configured to determine whether the displacement of the displaceable element is a valid displacement when a displacement sensor output signal from at least one of the displacement sensor elements exceeds a predetermined threshold.

7. The sensing apparatus of claim 1, wherein the displaceable element includes a sensing surface, and wherein the plurality of displacement sensor elements are arranged to sense displacement of the sensing surface of the displaceable element relative to the frame element.

8. The sensing apparatus of claim 7, wherein the one or more expected ratios for the at least two displacement sensor elements are indicative of a displacement caused by an object applying a force to the sensing surface of the displaceable element.

9. The sensing apparatus of claim 7, wherein the sensing surface of the displaceable sensing element includes a capacitive sensor element, configured to sense at least the presence of an object on or adjacent the sensing surface of the displaceable element.

10. The sensing apparatus of claim 9, wherein the processing circuitry is further configured to determine that displacement of the displaceable element is valid when the presence of an object on or adjacent the surface of the displaceable element within the sensing surface is detected.

11. The sensing apparatus of claim 9, wherein the processing circuitry is configured to determine the location of an object on the sensing surface of the displaceable element.

12. The sensing apparatus of claim 11, wherein the processing circuitry comprises a look-up table correlating a plurality of possible locations for an object to be detected on the sensing surface of the displaceable element to the one or more expected ratios for the at least two displacement sensor elements obtained in advance, and wherein the processing circuitry is configured to first identify the location of an object on the sensing surface of the displaceable element and then compare the ratio of the pair of displacement sensor elements to one or more expected ratios for the pair of displacement sensor elements obtained in advance.

13. The sensing apparatus of claim 7, wherein the displaceable element includes a second sensing surface, separate from the first sensing surface, and further comprising a second plurality of displacement sensor elements arranged to sense displacement of the second sensing surface of the displaceable element relative to the frame element.

14. The sensing apparatus of claim 13, wherein the second sensing surface comprises a capacitive sensor element, configured to sense at least the presence of an object on or adjacent the second sensing surface of the displaceable element.

15. A device comprising the apparatus of claim 1.

16. A method for determining whether a displacement applied to a displaceable element mounted relative to a frame element is a valid displacement, the method comprising:

obtaining a plurality of displacement sensor element output signals indicative of a displacement between the frame element and the displaceable element from a plurality of displacement sensor elements, wherein the plurality of displacement sensor elements are arranged at different spatial locations relative to the displaceable element and provide a displacement sensor output signal indicative of a displacement between the frame element and the displaceable element at the respective spatial location, and wherein the displaceable element comprises a sensing surface and a surrounding non-sensing surface, and wherein the displaceable element is configured to move along a displacement direction towards the frame element under application of a displacement load to the displaceable element by an object; and determining whether displacement of the displaceable element is a valid displacement by comparing at least the ratio between the displacement sensor output signals from a pair of the plurality of displacement sensor elements to one or more expected ratios for the pair of displacement sensor elements obtained in advance, wherein a valid displacement corresponds to a displacement load applied within the sensing surface of the displaceable element.

* * * * *